(12) United States Patent
Nagata et al.

(10) Patent No.: US 6,582,785 B2
(45) Date of Patent: Jun. 24, 2003

(54) SHIELD CASE FOR ELECTRONIC EQUIPMENT

(75) Inventors: Futoshi Nagata, Kanagawa (JP); Koji Otani, Kanagawa (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/785,646

(22) Filed: Feb. 23, 2001

(65) Prior Publication Data

US 2001/0018101 A1 Aug. 30, 2001

(30) Foreign Application Priority Data

Feb. 28, 2000 (JP) ......................................... 2000-050596

(51) Int. Cl.⁷ .......................... B29D 22/00; B29D 23/00; B65D 6/28; B65D 8/18
(52) U.S. Cl. ............... 428/34.1; 174/35 R; 174/35 GC; 361/679; 361/816; 312/265.5; 312/223.1; 312/223.2; 220/4.02
(58) Field of Search ................................ 428/34.1, 35.7, 428/35.2, 36.9, 36.91, 36.92; 174/35 R, 35 GC; 220/4.02; 361/683, 684, 735, 832, 830, 828, 685, 816, 817, 821, 818, 819, 820, 679; 312/257.1, 263, 265.5, 223.1, 223.2, 265

(56) References Cited

U.S. PATENT DOCUMENTS

| | | | | |
|---|---|---|---|---|
| 4,066,837 A | * | 1/1978 | Miura | 174/35 GC |
| 4,628,412 A | * | 12/1986 | Nigorikawa | 361/424 |
| 4,840,286 A | * | 6/1989 | Heberling et al. | 220/306 |
| 5,398,157 A | * | 3/1995 | Paul | 361/684 |
| 5,660,297 A | * | 8/1997 | Liu | 220/4.02 |
| 5,796,585 A | * | 8/1998 | Sugiyama et al. | 361/735 |
| 5,944,210 A | * | 8/1999 | Yetter | 220/4.21 |
| 6,111,760 A | * | 8/2000 | Nixon | 361/814 |
| 6,137,694 A | * | 10/2000 | Kerrigan et al. | 361/818 |
| 6,191,950 B1 | * | 2/2001 | Cox et al. | 361/737 |
| 6,195,244 B1 | * | 2/2001 | Barz | 361/111 |
| 6,462,959 B1 | * | 10/2002 | Fu et al. | 361/801 |

FOREIGN PATENT DOCUMENTS

| | | |
|---|---|---|
| JP | 7-45984 | 2/1995 |
| JP | 8-56085 | 2/1996 |

* cited by examiner

*Primary Examiner*—Harold Pyon
*Assistant Examiner*—Michael C. Miggins
(74) *Attorney, Agent, or Firm*—Whitham, Curtis & Christofferson, PC

(57) ABSTRACT

A front panel 11 has a plurality of caulking pieces 16 each of which is formed in a tongue-like shape defined by a pair of slits 17 in a side edge portion 11c of the front panel. The caulking piece is inwardly bent at its base end portion 16a and bent sideward at its distal end portion 16c to form a substantially L-shape. Side panels 12 whose forward end portions are abutted on an inner face 11a of the front panel 11. The side panels are formed along the forward end portions 12a with caulking holes 18 into which the caulking pieces 16 are adapted to be engaged. The front panel 11 is joined to a mount panel 2 in substantially intimate contact along its whole surface. The front panel 11 and the mount panel 2 are formed into an integral structure, whereby the mechanical strength in a direction of the thickness of the front panel can be maintained.

5 Claims, 3 Drawing Sheets

SHIELD CASE FOR ELECTRONIC EQUIPMENT

BACKGROUND OF THE INVENTION

The present invention relates to a shield case for an electronic equipment such as a receiver, an electronic tuner, an amplifier and so on, which is composed of a plurality of thin metal panels assembled to one another into a box-like shape, and in an interior of which wiring boards carrying thereon electronic elements, integrated circuit elements, etc., electronic components and so on are disposed.

Generally, in the electronic equipment such as the receiver, the electronic tuner, the amplifier and so on, the wiring boards carrying thereon the electronic elements, the integrated circuit elements, etc., the electronic components and so on have been disposed in a shield case which has been constructed by assembling thin metal panels. The electronic equipment has been so constructed that effects of electromagnetic noises from outside and occurring inside may be restrained, and mechanical protection can be attained by the shield case.

The related shield case is composed of constituent panels such as a front panel, side panels, a ceiling panel, a bottom panel or a back panel which are assembled to one another into a box-like shape. In the related shield case, the constituent panels have been assembled in such a manner that against a main face of one of the members is abutted a side end portion of a mating member, and then assembled with a caulking structure.

In other words, in the related shield case 100, as shown in FIGS. 5 and 6 for example, a side end portion 102a of a side panel 102 is abutted against an inner face 101a of a front panel 101, and assembled by means of a connecting structure which will be described later in detail. After the constituent panels have been assembled, the shield case 100 is attached to a mount panel 111 by means of fitting screws 111.

The front panel 101 is formed with a plurality of caulking holes 103 each having a rectangular shape along its side end portions 101b. The front panel 101 is also formed with a plurality of fitting holes 104 into which the fitting screws 111 are adapted to be screwed.

The side panel 102 is provided at the side end portion 102a with caulking pieces 105 in a shape of a tongue-like projection corresponding to the caulking holes 103. Each of the caulking pieces 105 is continuously formed from a base portion which is formed by cutting away a pair of slits 106 respectively opening in the side end portion 102a, and a distal end portion 105a is formed substantially in a shape of a hook. A sectional dimension of the distal end portion 105a of the caulking piece 105 is rather smaller than the size of the caulking hole 103.

In the shield case 100, the side end portion 102a of the side panel 102 is abutted against to the inner face 101a of the front panel 101, and the caulking pieces 105 are respectively engaged in the associated caulking holes 103. In the shield case 100, the distal end portion 105a of the caulking piece 105 which is projected from a front face 101c of the front panel 101 is bent downward by caulking treatment. In the shield case 100, as shown in FIG. 6, the bent distal end portion 105a of the caulking piece 105 is locked at an edge of the caulking hole 103 whereby the side panel 102 is assembled to the front panel 101. By assembling all the constituent panels by means of a similar structure, the shield case 100 is constructed in a box-like shape as a whole.

In the shield case 100, the above described constituent panels are assembled to one another without employing any fastening means such as screws, welding or deposition. The shield case 100 is attached to the mount panel 110 by means of the fitting screws 111 in a state where the circuit boards equipped with the integrated circuit elements or so, the electronic components or the like have been disposed inside and a ceiling panel (not shown) has been assembled thereto.

In the related shield case 100, the distal end portion 105a of the caulking piece 105 is projected from the front face 101c of the front panel 101 as described above. In a state where the shield case 100 has been attached to the mount panel 110, the distal end portion 105a is abutted against the inner face 110a of the mount panel 110, as shown in FIG. 6. Accordingly, when the shield case 100 is attached to the mount panel 110, there is formed a gap t corresponding to a thickness of the distal end portion 105a of the caulking piece 105 between the front face 101c of the front panel 101 and the inner face 110a of the mount panel 110 as shown in the same drawing.

The front panel 101 and the side panel 102 of the shield case 100 are formed of the thin metal panels as described above, and are rather weak in mechanical strength in a direction of their thickness. Therefore, since there is provided the gap, the front panel 101 is likely to be deformed or flexed in a direction of its thickness in case where the shield case 100 has become heavy with a number of the circuit boards, the electronic components an so on disposed therein or an impactive force is applied to the shield case. For this reason, there has been a problem in the shield case 100 that sufficient shielding performance cannot be attained, because gaps may occur between the front panel 101 and the side panel 102, or between the front panel 101 and the ceiling panel or the bottom panel. There has been a further problem that the shield case 100 cannot be firmly attached to the mount panel 110.

It has been considered that the front panel 101 of the shield case 100 may be formed of a thick metal panel. However, this will lead to a problem that an overall cost will be increased because cost for material, changes in manufacturing steps of the components and in control steps, etc. are required. There will be a further problem that the shield case 100 may become larger in size and heavier in weight by employing such a countermeasure.

SUMAMRY OF THE INVENTION

In view of the above, it is an object of the present invention to provide a shield case for an electronic equipment in which mechanical strength of a front panel is enhanced to maintain reliable shielding performance.

In order to achieve the above object, according to the present invention, there is provided a shield case accommodating therein an electronic equipment and mounted on a mount panel, comprising:

a first panel, an outer face of which is brought into an intimate contact with the mount panel to fix the shield case thereon;

a calking piece provided with a first arm portion extended from a side edge portion of the first panel toward inside of the shield case, and second arm portion connected to the first arm portion so as to extend substantially parallel with the first panel toward outside of the shield casing; and a second panel, a side edge of which is abutted on an inner face of the first panel, the second panel formed with an calking hole through which the second arm portion of the calking piece is inserted.

In this configuration, the second panel is assembled to the first panel by applying caulking treatment to the distal end portion of the caulking piece which is projected from the caulking hole. The first panel is attached to the mount panel, and joined thereto to be fixed by fitting screws or the like. Since the first panel is joined to the mount panel in substantially intimate contact along its whole surface, mechanical strength in a direction of its thickness will be maintained, and deformation of the first panel can be restrained even when a large load, an impact or so is applied thereto, whereby the shielding performance can be maintained.

DETAILED DESCRIPTION OF THE PREFERRED EMBODIMENTS

Figure 3:
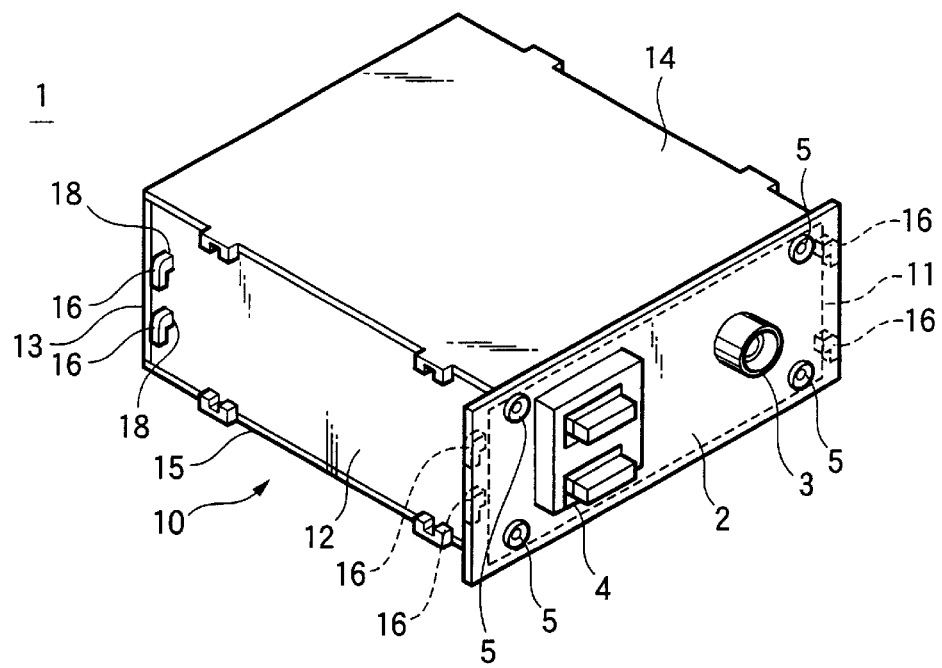
FIG. 3 is a perspective view of the shield case in a state attached to a mount panel.
Figure 4:
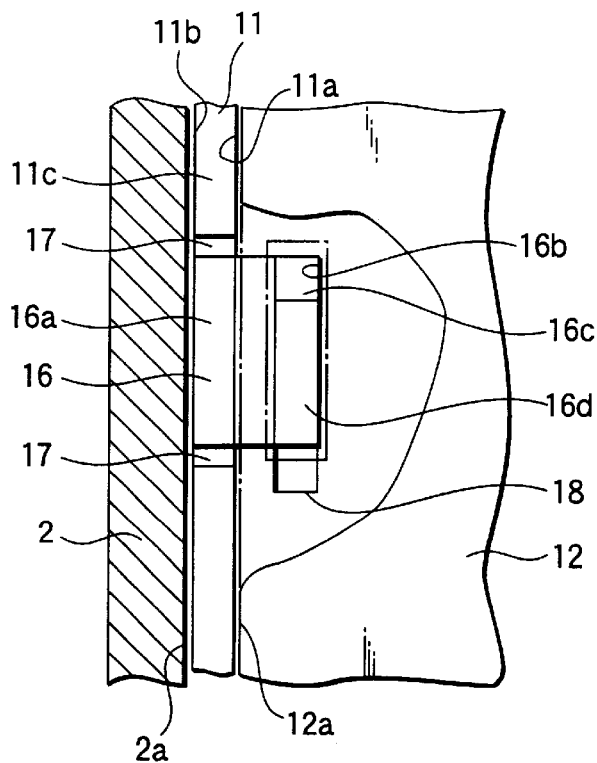
FIG. 4 is a side view of the essential part partly cut away illustrating in detail a mount part between the shield case and the mount panel.
Figure 5:
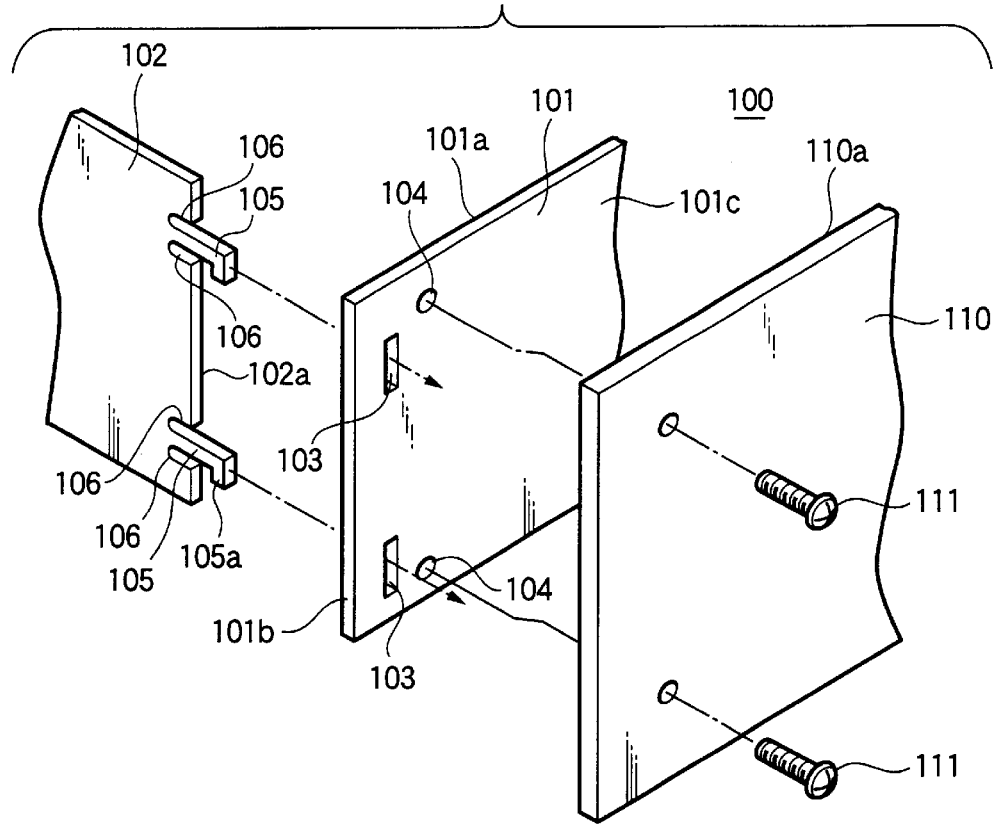
FIG. 5 is an exploded perspective view of an essential part of a related shield case and a mount panel.
Figure 6:
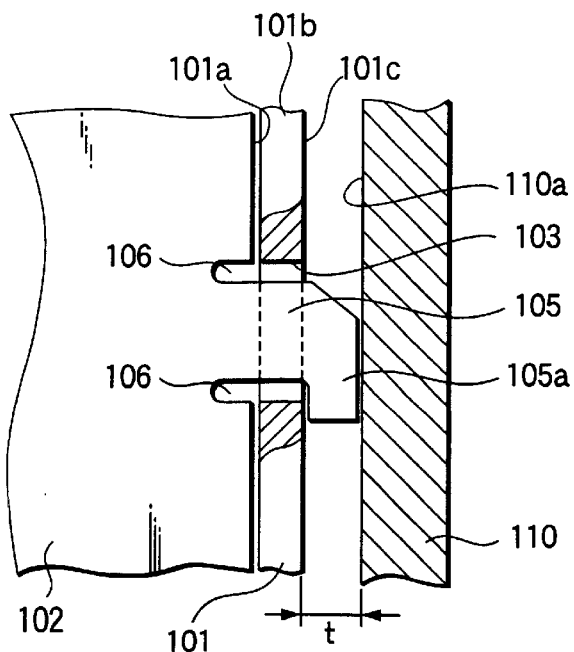
FIG. 6 is a side view of the essential part partly cut away illustrating in detail a mount part between the related shield case and the mount panel.

Now, one embodiment of the invention will be described in detail referring to the accompanying drawings. A shield case 10 illustrated as an example is applied to a receiver 1 having a mount panel 2 which is provided with a coaxial connector 3 for inputting high frequencies and a feeder terminal connector 4 for outputting the high frequencies as shown in FIG. 3. Although not described here in detail, the receiver 1 includes wiring boards carrying thereon electronic elements and integrated circuit elements, etc. which constitute a receiving circuit, a control circuit, etc. or electronic components and so on disposed in the shield case 10. The receiver 1 is constructed by fixing a front panel 11 of the shield case 10 to an inner face of the mount panel 2 by fitting screws 5 as described below.

The shield case 10 is constructed in a box-like shape by assembling the front panel 11, left and right side panels 12, a back panel 13, a ceiling panel 14, and a bottom panel 15 which have been respectively formed of thin metal panels to one another. It is apparent that these members of the shield case 10 are not only formed independently, but an integral member consisting of the left and right side panels 12 and the bottom panel 15 formed in a substantially U-shape, or an integral member consisting of these panels and the back panel 13 may be employed. In the shield case 10, although not shown in the drawings, the side panel 12 may be provided with an opening through which a pin connector mounted on a circuit board to perform a connection with a CPU is exposed outward, or the ceiling panel 14 and the back panel 15 may be formed with a plurality of undulated ribs for reinforcement.

The front panel 11 is formed of a rectangular panel which is smaller than an outer shape of the mount panel 2. The side panel 12 is abutted against an inner face 11a of the front panel 11, and at the same time, a front face 11b of the front panel 11 is attached to an inner face 2a of the mount panel 2 as described below. The front panel 11 is provided with fitting holes at its four corners, although not shown in the drawings. The fitting holes are in positions respectively corresponding to the fitting holes formed in the mount panel 2, and the front panel 11 is attached and fixed to the mount panel 2 by screwing the fitting screws 5 into the fitting holes.

Figure 1:
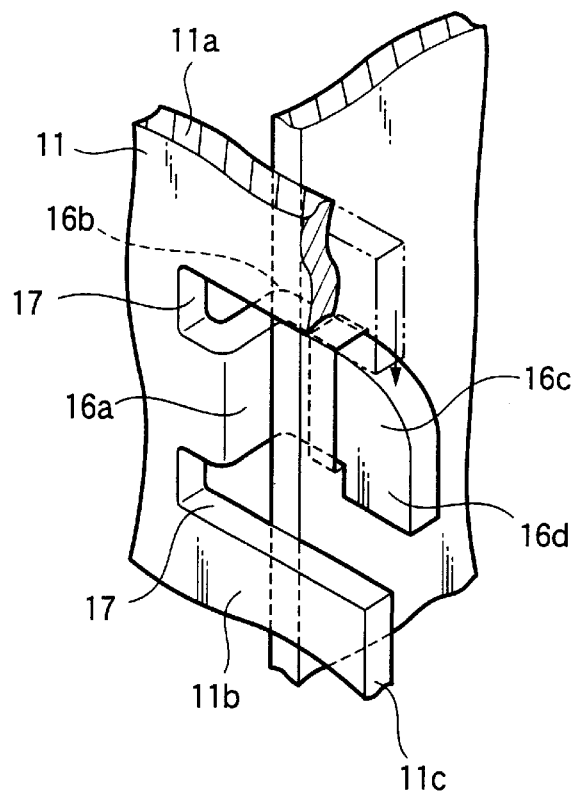
FIG. 1 is a perspective view of an essential part of a shield case according to one embodiment of the invention.
Figure 2:
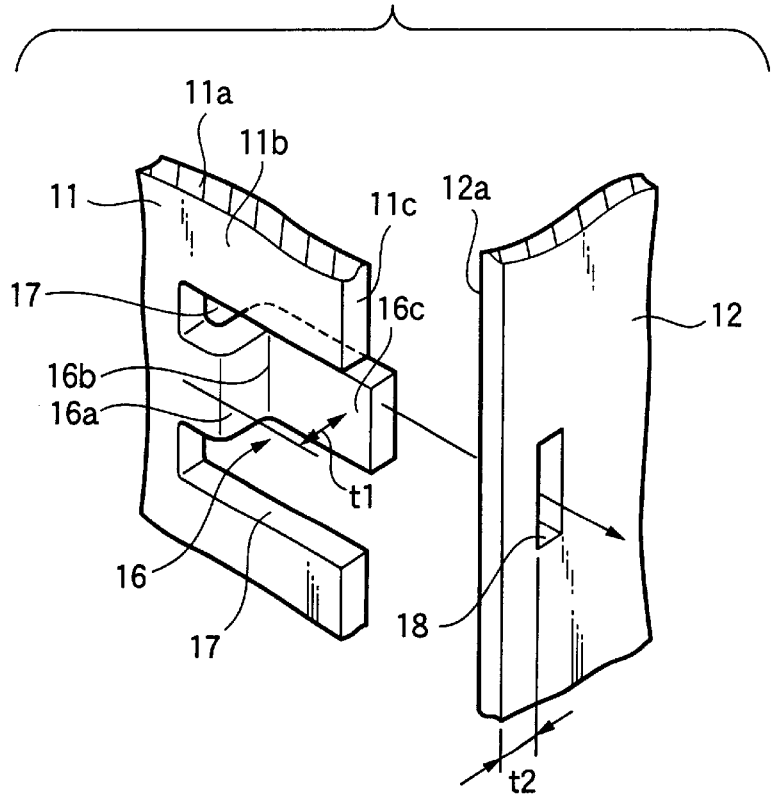
FIG. 2 is an exploded perspective view of the essential part of the shield case.

The front panel 11 is integrally formed with a pair of upper and lower caulking pieces 16 along both side edge portions thereof. Each of the caulking pieces 16, though only one of them on the right hand is shown in FIGS. 1 and 2, is formed in a tongue-like shape by cutting away a pair of slits 17 which open in the side edge portion 11c of the front panel 11, and each has a total length projecting forward from the side edge portion 11c. The slit 17 is formed from the side edge portion 11c having a length larger than a thickness of the side panel 12.

A base end portion 16a of the caulking piece 16 is bent at a right angle toward inside of the case as shown in FIGS. 1 and 2. The caulking piece 16 in general presents a substantially L-shape with the base end portion 16a and an engaging portion 16c which is formed by bending its distal end portion at a right angle at a bent part 16b so as to be in parallel to the inner face 11a of the front panel 11. A length of the base end portion 16a of the caulking piece 16, in other words, a distance from the inner face 11a to the bent part 16b is set to be t1. A length from the bent part 16b to a distal end edge of the engaging portion 16c is substantially equal to a length of the slit 17. In other words, the distal end edge is on a substantially same plane as the side edge portion 11c.

The side panel 12 is formed with a pair of upper and lower caulking holes 18 along both side edge portions 12a, although only one of the caulking holes 18 at the distal end side is shown in FIGS. 1 and 2. The caulking holes 18 are in positions respectively corresponding to the caulking pieces 16 of the front panel 11. The rectangular caulking hole 18 has a size substantially equal to a sectional dimension of the engaging portion 16c of the caulking piece 16. A distance t2 of the caulking hole 18 from the side edge portion 12a is substantially equal to the opposed distance t1 between the inner face 11a of the front panel 11 and the engaging portion 16c of the caulking piece 16 as shown in FIG. 2.

When the side panel 12 constructed as described above is pushed inwardly with its side edge portion 12a abutted against the inner face 11a of the front panel 11, the engaging portions 16c of the caulking pieces 16 are respectively engaged in the corresponding caulking holes 18 as shown by an arrow in FIG. 2. In this state, the side panel 12 is pushed in until its inner face 12b comes in contact with the base portion 16a of the caulking piece 16.

In this state of the caulking pieces 16, the distal end portions 16d of the engaging portions 16c are projected and exposed outward from the side panel 12 through the respective caulking holes 18. A caulking treatment is applied to the caulking pieces 16 to fold the distal end portions 16d of the engaging portions 16c, as shown by an arrow in FIG. 1. Although the caulking pieces 16 receive caulking forces to be bent in a direction of its width, the caulking pieces 16 can be plastically deformed because they are formed of the thin metal panel. The side panel 12 is assembled to the front panel 11 by locking the bent distal end portions 16d of the caulking pieces 16 with the opening edges of the caulking holes 18, as shown in the same drawing.

The caulking piece 16 in this embodiment is constructed in such a manner that the distal end portion 16d of the engaging portion 16c is bent with respect to a vertical direction and caulked into the caulking hole 18. However, the caulking piece is not necessarily limited to such a structure. The engaging portion 16c of the caulking piece 16 may be formed substantially in a shape of a sector, and the distal end portion projected and exposed from the caulking hole 18 may be twisted and caulked, or may be formed in various other shapes.

The side panel 12 and the back panel 13 are assembled by means of a similar structure to construct a generally frame-like intermediate body of the shield case 10. After the bottom panel 15 has been assembled to this intermediate body by means of an appropriate structure, the circuit boards, the electronic components and so on are disposed inside. The shield case 10 is constructed into a box-like shape as a whole after the ceiling panel 14 has been assembled to the intermediate body by means of an appropriate structure.

The shield case 10 is fixed to the mount panel 2 with the front face 11b of the front panel 11 attached to the inner face 2a of the mount panel 2 by bringing the respective fitting holes into alignment, and by screwing the fitting screws 5 into the fitting holes in this state as described above. Because the front face 11b of the front panel 11 is formed as a flat plane as described above, the front panel 11 of the shield case 10 can be joined with the inner face 2a of the mount panel 2 in substantially intimate contact along the whole face.

Accordingly, because the front panel 11 is supported by the mount panel 2 to make an integral structure, the mechanical strength of the shield case 10 will be remarkably enhanced in a direction of the thickness of the front panel 11, although it is formed of the thin metal panels. Even in case where the shield case 10 has become heavy due to a number of the circuit boards and the electronic components disposed therein, or an impact is applied thereto, deformation, etc. of the front panel 11 will be restrained. By avoiding occurrence of the gap between the front panel 11 and the side panel 12, the shield case 10 can maintain the shielding performance and can be firmly attached.

Although the shield case 10 applied to the receiver 1 has been described in the above described embodiment, it is obvious that the invention can be applied to the shield cases for other electronic equipments. Although the front panel 11 and the side panel 12, and the side panel 12 and the back panel 13 of the shield case 10 are assembled by the above described caulking structure, the ceiling panel 14 or the bottom panel 15 may be also assembled to the side panel 12 by the similar caulking structure. In this case, the back panel 13, the ceiling panel 14 or the bottom panel 15 of the shield case 10 are mounted onto the mount panel or the like, in other words, the caulking pieces 16 may be formed at positions where the shield case 10 is attached to the mount panel 2 so as not to protrude thereto.

What is claimed is:

1. A shield case accepting therein electronic equipment and mounted on a mount panel, comprising:
   a first panel, an outer face of which is brought into intimate contact with the mount panel to fix the shield case thereon;
   a calking piece provided with a first arm portion extended from a side edge portion of the first panel toward inside of the shield case, and a second arm portion connected to the first arm portion to extend substantially parallel with the first panel toward outside of the shield casing; and
   a second panel, a side edge of which is abutted on an inner face of the first panel, the second panel formed with a calking hole through which the second arm portion of the calking piece is inserted.

2. The shield case as set forth in claim 1, wherein a length between the side edge of the second panel and an opening edge of the calking hole opposing to the side edge is substantially identical with a length of the first arm portion of the calking piece.

3. The shield case as set forth in claim 1, wherein a distal end of the second arm portion of the calking piece exposed on an outer face of the second panel is bent to assemble the second panel with the first panel.

4. The shield case as set forth in claim 1, wherein the first and second arm portions of the calking piece is integrally formed with the first panel.

5. The shield case as set forth in claim 4, wherein a pair of slits are formed on the side edge portion of the first panel to define the calking piece.

* * * * *